(12) United States Patent
Park et al.

(10) Patent No.: US 6,992,394 B2
(45) Date of Patent: Jan. 31, 2006

(54) MULTI-LEVEL CONDUCTIVE LINES WITH REDUCED PITCH

(75) Inventors: Young-Jin Park, Kyoungki-do (KR); Gerhard Mueller, Meitingen (DE)

(73) Assignee: Infineon Technologies AG, Munich (DE)

( * ) Notice: Subject to any disclaimer, the term of this patent is extended or adjusted under 35 U.S.C. 154(b) by 237 days.

(21) Appl. No.: 09/964,205

(22) Filed: Sep. 26, 2001

(65) Prior Publication Data

US 2003/0210103 A1 Nov. 13, 2003

Related U.S. Application Data

(63) Continuation-in-part of application No. 09/751,492, filed on Dec. 28, 2000, now Pat. No. 6,469,392.

(51) Int. Cl.
*H01L 23/528* (2006.01)

(52) U.S. Cl. ...................... 257/775; 257/773
(58) Field of Classification Search ............... 257/773, 257/775
See application file for complete search history.

(56) References Cited

U.S. PATENT DOCUMENTS

| | | | | |
|---|---|---|---|---|
| 4,030,116 A | * | 6/1977 | Blumenfeld | 257/45 |
| 4,914,056 A | | 4/1990 | Okumura | |
| 4,975,753 A | * | 12/1990 | Ema | 257/296 |
| 5,471,095 A | | 11/1995 | Kaminaga et al. | |
| 5,581,091 A | * | 12/1996 | Moskovits et al. | 257/773 |
| 5,693,563 A | * | 12/1997 | Teong | 438/627 |
| 5,726,498 A | * | 3/1998 | Licata et al. | 257/773 |
| 6,111,277 A | * | 8/2000 | Ikeda | 257/99 |

FOREIGN PATENT DOCUMENTS

| | | | |
|---|---|---|---|
| EP | 0978 875 A1 | | 2/2000 |
| JP | 02-001917 | | 1/1990 |
| JP | 02-178951 | | 7/1990 |
| JP | 08-213392 | | 8/1996 |
| JP | 10233511 A | * | 9/1998 |
| WO | WO 99/67823 | | 12/1999 |

* cited by examiner

*Primary Examiner*—Allan R. Wilson
(74) *Attorney, Agent, or Firm*—Slater & Matsil, L.L.P.

(57) ABSTRACT

The invention describes the use of conductive lines having a non-rectangular shaped cross section to reduce line capacitance for a given pitch. Such conductive lines can reduce the height of integrated circuits with multi-level conductive lines without increasing line-to-line capacitance.

29 Claims, 12 Drawing Sheets

MULTI-LEVEL CONDUCTIVE LINES WITH REDUCED PITCH

This application is a continuation-in-part of U.S. patent application U.S. Ser. No. 09/751,492, filed Dec. 28, 2000, now U.S. Pat. No. 6,469,392.

FIELD OF THE INVENTION

The present invention relates to integrated circuits and, more particularly, to integrated circuits with multi-level conductive lines with reduced line pitch.

BACKGROUND OF THE INVENTION

In integrated circuits, parallel conductive lines are widely used to interconnect circuit elements. FIG. 1 shows conductive lines 120 formed on a substrate 101, separated by line spaces 135. The width of the line spacing and conductive line is referred to as the "line pitch". A limiting factor to reducing the line pitch is the minimum resolution or feature size (F) of a specific lithographic tool. With the line spacing and line width equal to 1F each, the minimum line pitch is 2F.

One technique for reducing line pitch below 2F is to provide an additional level 165 on which second conductive lines 125 are formed. By staggering the lines between first and second levels 160 and 165, a line pitch of less than 2F can be achieved. Reducing the line pitch is desirable since it reduces chip size, thus reducing manufacturing costs since more chips can be fabricated on a wafer. However, when the line pitch is reduced, the line capacitance increases due to the larger line-to-line capacitance. Larger line capacitance is undesirable as it increases power consumption. In addition, the larger line capacitance can negatively affect the signal integrity due to coupling noise from neighboring lines, reducing yield.

As evidenced from the foregoing discussion, it is desirable to reduce the line pitch in order to reduce the chip area. In addition, it is desirable to reduce the line-to-line capacitance and the total line capacitance for a given pitch.

SUMMARY OF THE INVENTION

The invention relates to multi-level conductive lines having reduced capacitance for a given pitch. In one embodiment, at least conductive lines on one of the multi-levels comprise non-rectangular shaped cross-sections. The use of non-rectangular shaped conductive lines increases the effective spacing between conductive lines, thus reducing capacitance of conductive lines for a given pitch.

DETAILED DESCRIPTION OF THE INVENTION

Figure 1:
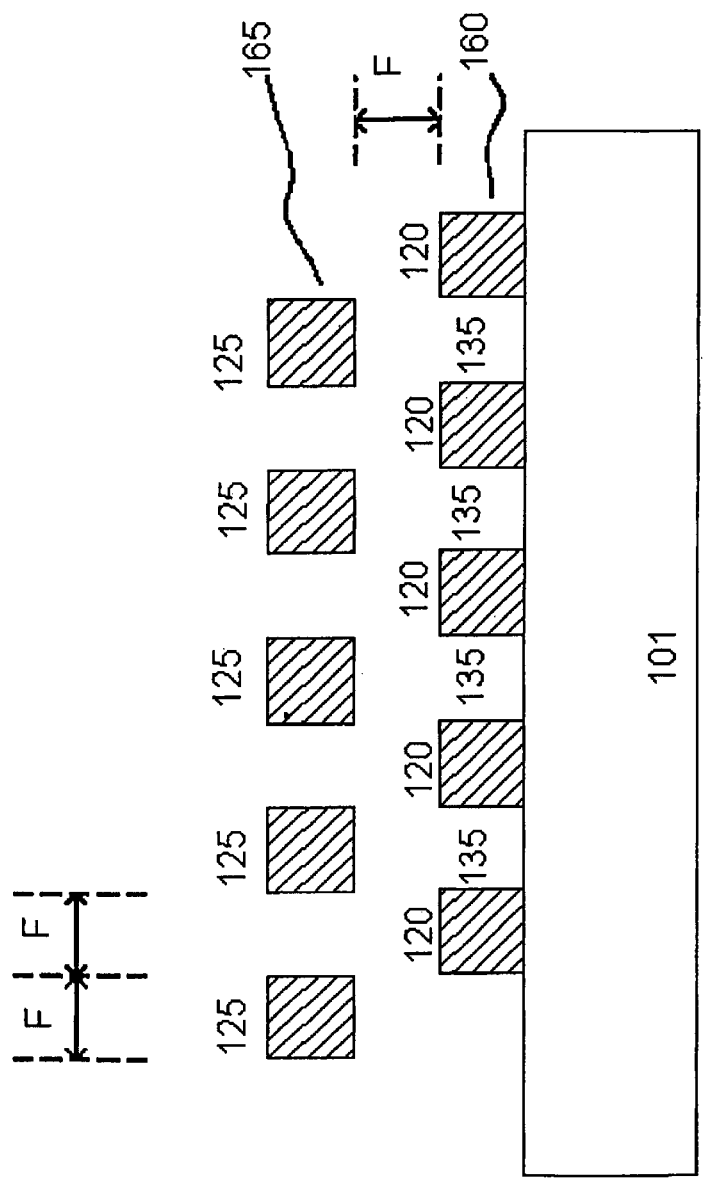
FIG. 1 shows an integrated circuit with conventional multi-level conductive lines.
Figure 2:
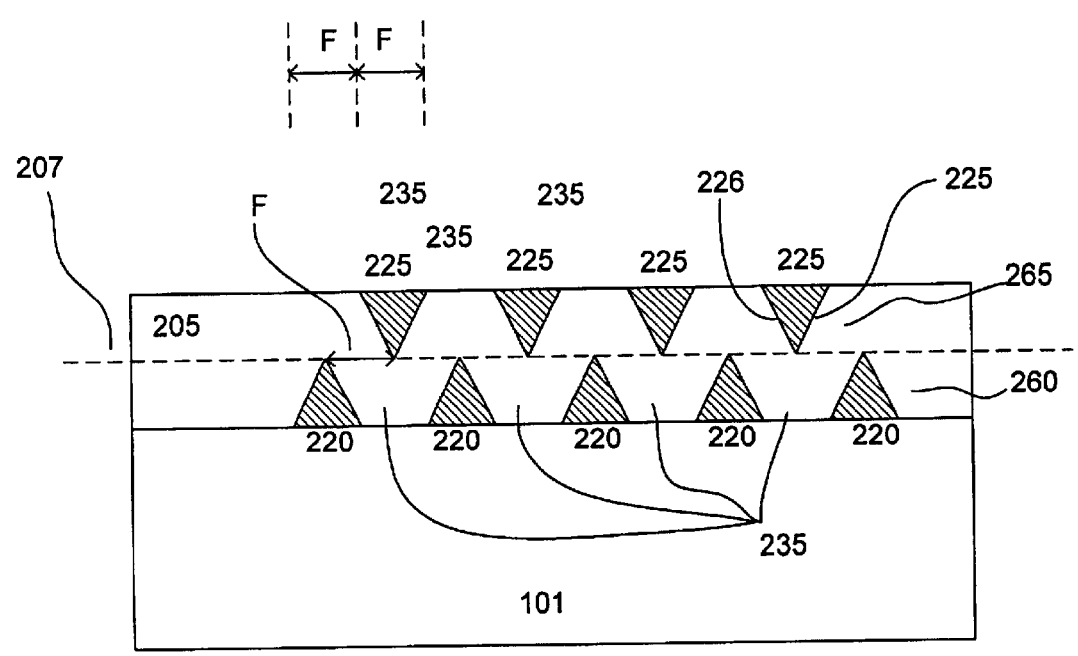
FIG. 2 shows an integrated circuit with multi-level conductive lines in accordance with one embodiment of the invention.

FIG. 2 shows an integrated circuit having multi-level conductive lines in accordance with one embodiment of the invention. A substrate 101 is provided on which conductive lines 220 and 225 are formed. Typically, the width of a conductive line is limited to about 1F. Line widths of greater than 1F can also be used, as desired. The conductive lines are located on first and second conductive levels 260 and 265 and isolated from each other by a dielectric layer 205. The substrate, for example, comprises a dielectric layer over a semiconductor substrate having circuit features formed thereon. Contacts are provided to electrically couple the circuit features with the conductive lines. However, for sake of simplification, the contacts and circuit features are not shown.

In accordance with the invention, at least the conductive lines on one of the levels comprise non-rectangular cross-sections. Preferably, conductive lines in the different levels comprise non-rectangular cross-sections. In one embodiment, the non-rectangular conductive lines comprise at least one non-vertical sidewall. The non-vertical sidewall tapers toward the other sidewall. Providing conductive lines having two non-vertical sidewalls are also useful. The sidewalls, for example, converge to form conductive lines with a triangular shaped cross-section. Alternatively, the sidewalls do not converge. In one embodiment, conductive lines with non-rectangular shaped cross sections on the lower level have sidewalls tapering towards each other at the top of the conductive lines. Conductive lines with non-rectangular shaped cross-sections on the upper level have sidewalls tapering towards each other at the bottom of the conductive line.

By providing conductive lines with non-rectangular cross-sections, the effective pitch is greater than the actual pitch. For example, as shown in FIG. 2, the pitch between the lines on the same level is 2F, 1F for the line width and 1F for the line spacing. However, due to the non-vertical sidewalls, the effective spacing between the conductive lines is greater than 1F. Thus, the use of conductive lines with non-rectangular shaped cross-sections reduces the line-to-line capacitance, resulting in a reduction in coupling noise and power consumption for a given pitch.

In one embodiment, the conductive lines on the different levels comprise first and second non-vertical sidewalls 225 and 226 which converge to form a triangular shaped cross-section. The conductive lines on the lower level have sidewalls which taper toward each other at the top of the conductive lines while the conductive lines on the upper level have sidewalls which taper at the bottom of the conductive lines. As shown, the top and bottom of the conductive lines on the different levels are coplanar. Providing conductive lines with non-rectangular shaped cross sections on different levels can reduce the overall height of the device without increasing the line-to-line capacitance. This is because the effective spacing between the lines on the different levels is greater than the actual line spacing between the different levels. For example, as shown in FIG. 2, the actual distance between the two levels is zero (two levels are contiguous) but the effective distance between the top of the conductive lines on the lower level and the bottom of the conductive lines on the upper level is about 1F. Alternatively, the distance between the two levels can be increased to reduce the line-to-line capacitance between conductive lines on the different levels as desired.

Figure 3:
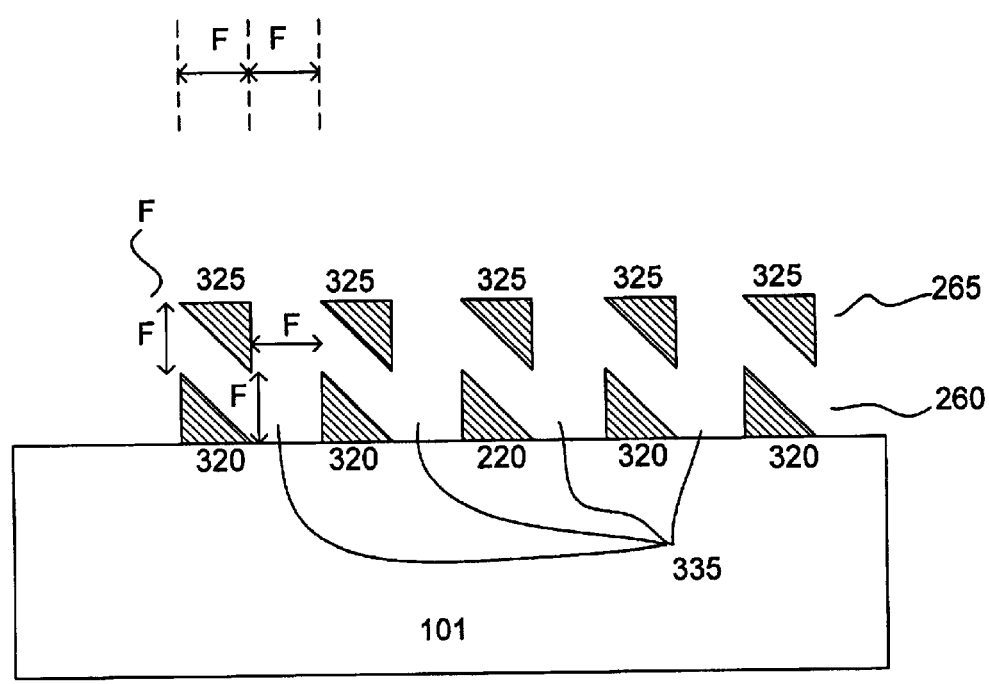
FIGS. 3–5 show multi-level conductive lines in accordance with alternative embodiments of the invention.

FIG. 3 shows an alternative embodiment of the invention for reducing capacitance for a given pitch. Conductive lines 320 and 325 are formed in respective first and second levels 260 and 265. The conductive lines comprise a vertical sidewall and a non-vertical sidewall. The non-vertical sidewall tapers toward the vertical sidewall. In one embodiment, sidewalls converge. In one embodiment, adjacent sidewalls of adjacent conductive lines on the different levels have substantially the same angle. Like the embodiment described in FIG. 2, the use non-rectangular shaped cross-sections enables a reduction in the overall height of the device without increasing the line capacitance or line-to-line capacitance.

Figure 4:
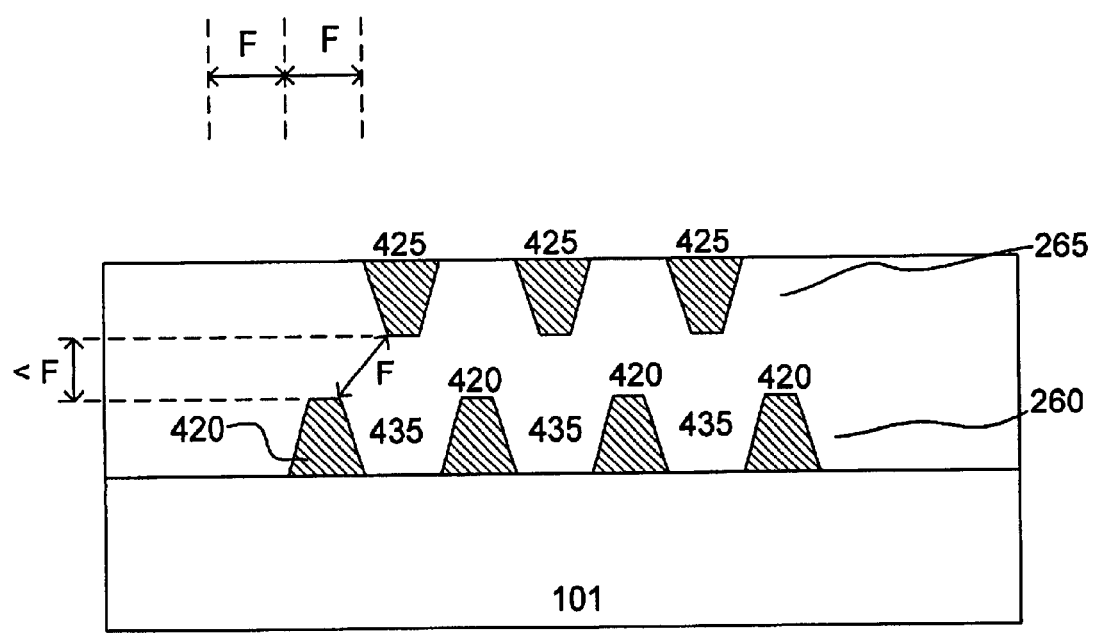

FIG. 4 shows another embodiment of the invention. The conductive lines 420 and 425 are formed on first and second levels 260 and 265. The conductive lines comprise first and second non-vertical sidewalls which taper toward each other. The sidewalls do not converge. Like the embodiments described in FIGS. 2–3, the use non-rectangular shaped cross-sections enables a reduction in the overall height of the device without increasing the line-to-line capacitance or coupling capacitance between the conductive lines of the different levels.

Figure 5:
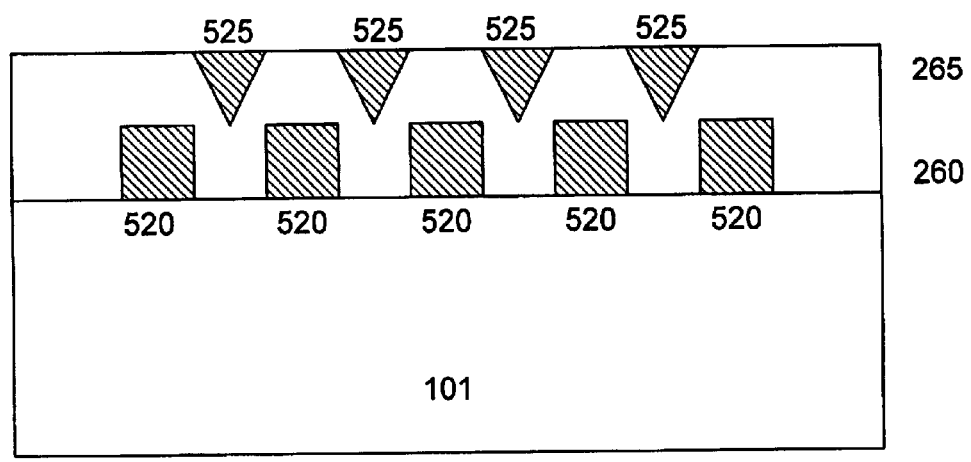

FIG. 5 shows yet another embodiment an IC with multi-level conductive lines. The conductive lines 520 and 525 are located on first and second levels 260 and 265 on the substrate. Conductive lines on one level have rectangular-shaped cross-sections while the conductive lines on the other level have non-rectangular-shaped cross-sections. In one embodiment, the first conductive lines on the lower level have rectangular-shaped cross-sections while the second conductive lines on the upper level have non-rectangular cross-sections. The second conductive lines, in one embodiment, comprise non-vertical sidewalls which taper toward each other toward the bottom to form triangular-shaped cross-sections. The use of non-rectangular shaped conductive lines in at least one level results in smaller capacitance between the conductive lines of the different levels for a given line pitch than conventional approaches using of rectangular shaped conductive lines.

Figure 6:
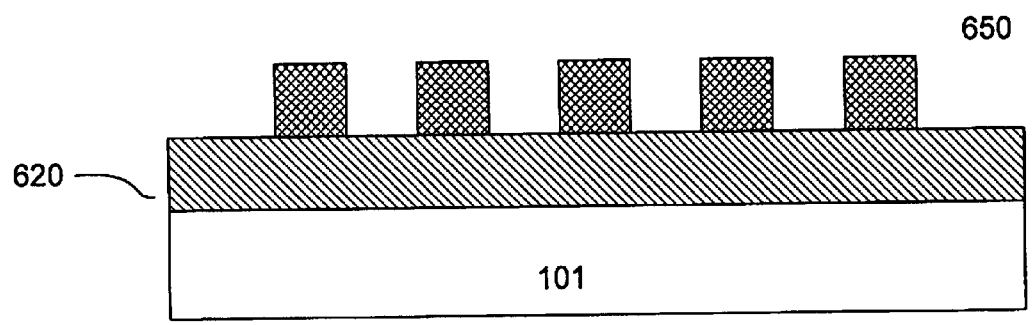
FIGS. 6–9 show a process for fabricating conductive lines in accordance with one embodiment of the invention.

FIGS. 6–11 show a process for forming conductive lines in accordance with one embodiment of the invention. Referring to FIG. 6, a substrate 101 is provided. Above the substrate is deposited a conductive layer 620. The conductive layer comprises, for example, aluminum, copper, or alloys thereof. Other types of conductive materials can also be used. A mask layer 650, such as resist, is deposited and patterned to selectively expose portions of the conductive layer.

Figure 7:
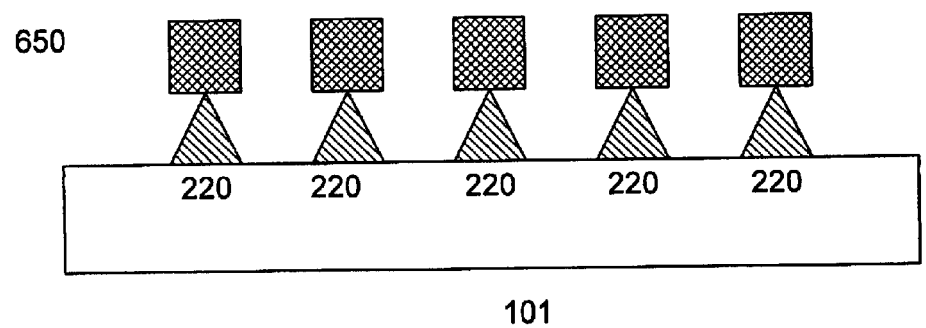

Referring to FIG. 7, the conductive layer is patterned. In one embodiment, the conductive layer is patterned using, for example, an isotropic etch. The isotropic etch comprises, for example, a wet etch. The etch forms conductive lines 220 beneath the resist. In one embodiment, the conductive lines comprise triangular shaped cross-sections. After the conductive lines are formed, the resist is removed.

Figure 8:
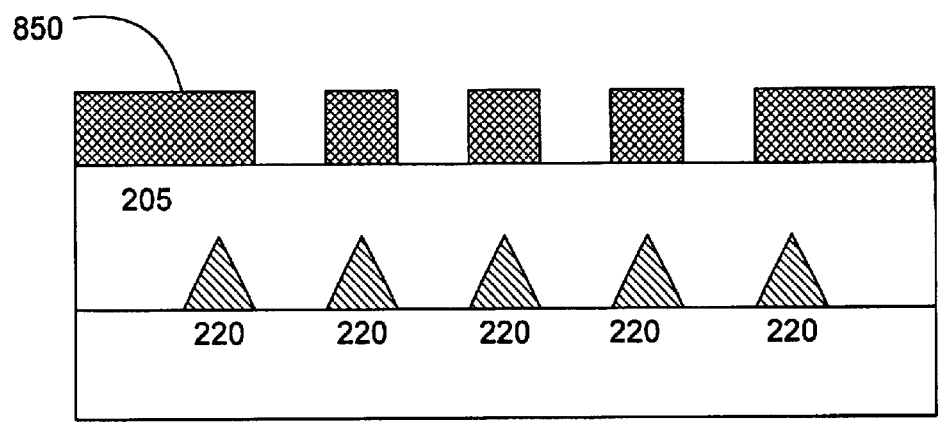

Referring to FIG. 8, a dielectric layer 205 is deposited over the conductive lines. The dielectric layer comprises, for example, silicon oxide, silicate glass, doped silicate glass, or silicon nitride. The dielectric layer can be planarized as necessary to provide a planar top surface. The use of a self-planarizing dielectric material, such as spin-on-glass, is also useful. In one embodiment, the thickness of the dielectric layer is about twice the thickness of the conductive lines. A mask layer 850 is deposited and patterned, exposing portions of the dielectric layer. In one embodiment, the resist covers the dielectric layer above the conductive lines 220.

Figure 9:
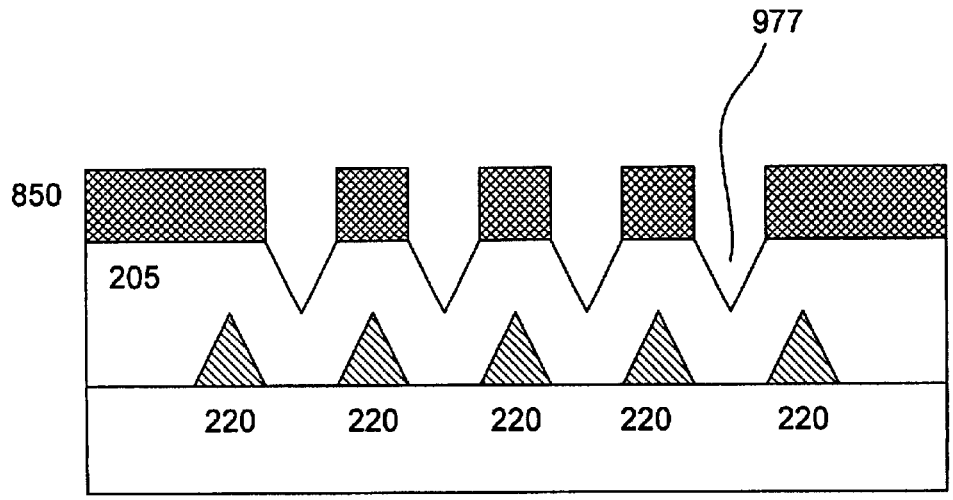

In FIG. 9, the dielectric layer is etched using an isotropic etch. The etch forms trenches 977 with non-vertical sidewalls tapering toward each other to form triangular-shaped trenches. After the trenches are formed, the mask layer is removed. Subsequently, a conductive layer (not shown) is deposited over the dielectric layer to fill the trenches. The structure is then polished by, for example, chemical mechanical polishing (CMP) to remove excess conductive material, leaving conductive lines in the trenches. Additional processing is performed to complete the IC.

Figure 10:
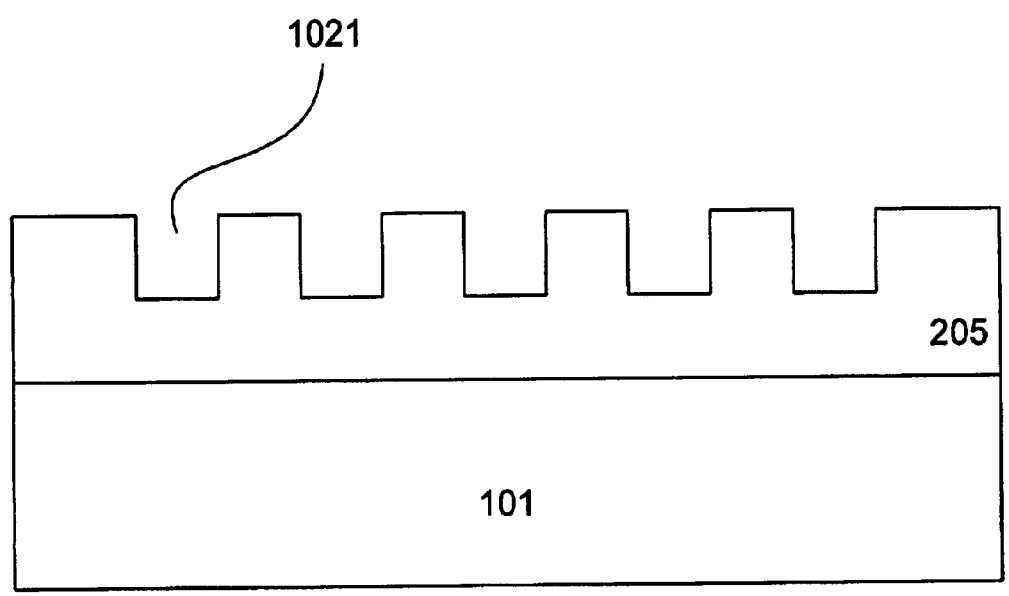
FIGS. 10–14 show a process for fabricating conductive lines in accordance with another embodiment of the invention.

FIGS. 10–14 show a process for forming conductive lines in accordance with another embodiment of the invention. Referring to FIG. 10, a substrate 101 with a dielectric layer 205 deposited thereon is provided. The dielectric layer is patterned, forming trenches 1021. The trenches, in one embodiment, comprise substantially vertical sidewalls. Vertical sideswalls can be obtained by anisotropic etching techniques (e.g., ion milling or reactive ion etching).

Figure 11:
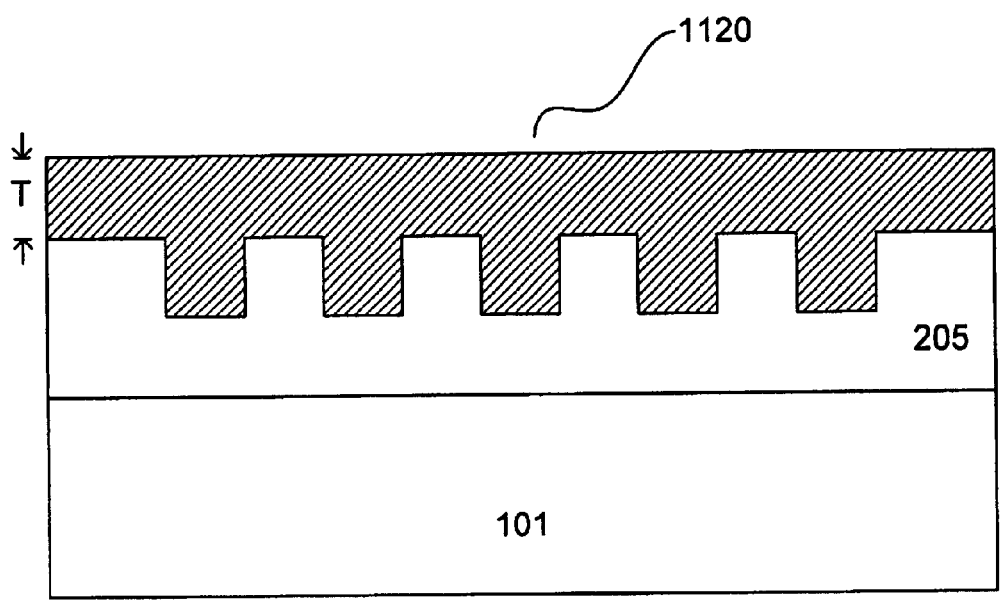

Referring to FIG. 11, a conductive layer 1120 is deposited on the dielectric layer. The conductive layer comprises, for example, aluminum, copper, or alloys thereof. Other types of conductive materials can also be used. If necessary, the surface of the conductive layer is planarized to provide a planar top surface.

Figure 12:
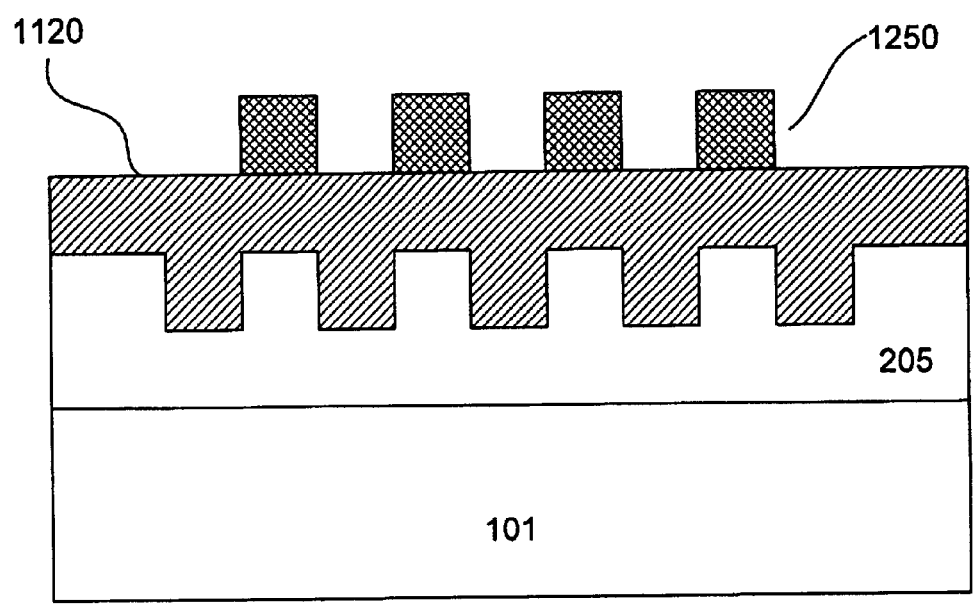

Referring to FIG. 12, a mask layer 1250, such as resist, is deposited and patterned to expose portions of the conductive layer. In one embodiment, the resist covers the portions of the conductive layer where conductive lines on the second level are to be formed.

Figure 13:
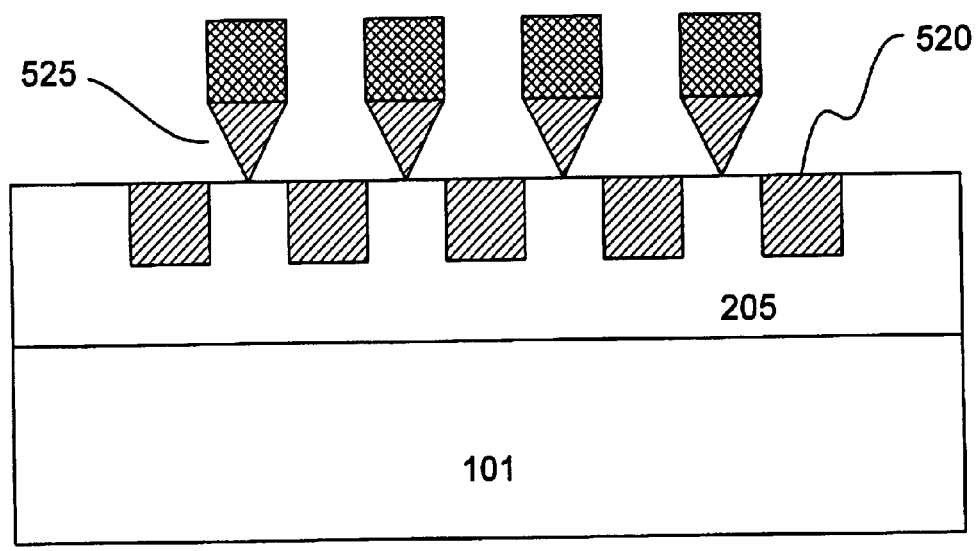

Referring to FIG. 13, the conductive layer is patterned. In one embodiment, the conductive layer is patterned using, for example, an isotropic etch. The isotropic etch comprises, for example, a wet etch. Other isotropic etch techniques, are also useful. The etch forms conductive lines 520 in the trenches and conductive lines 525 above the dielectric layer. The conductive lines 525, in one embodiment, comprise non-vertical sidewalls that taper toward each other, forming triangular-shaped cross-sections. In one embodiment, the conductive lines comprise triangular-shaped cross-sections. After the conductive lines are formed, the resist is removed.

Figure 14:
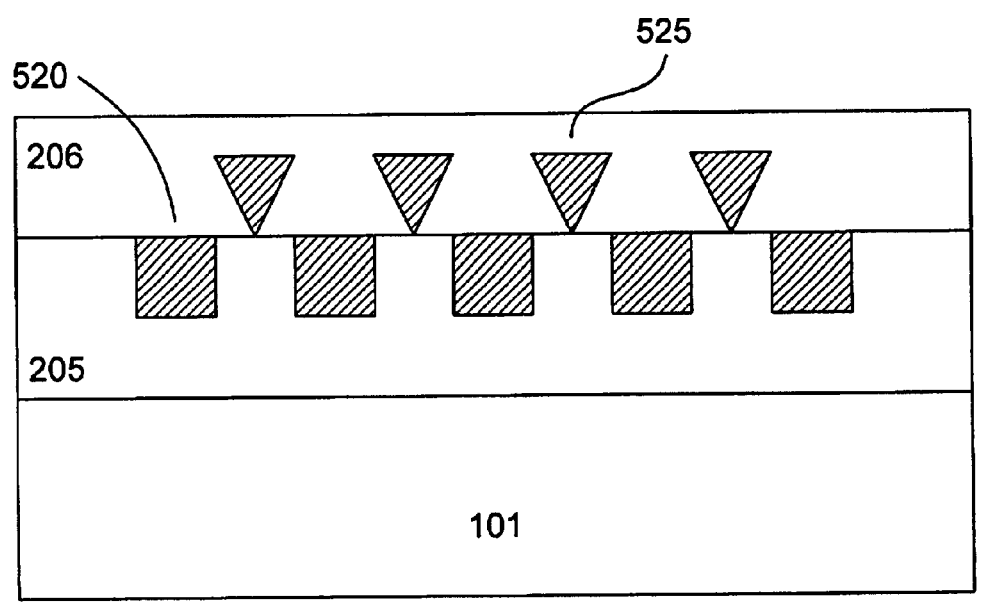

Referring to FIG. 14, a dielectric layer 206 is deposited, covering the conductive lines and dielectric layer 205. The dielectric layer comprises, for example, oxide, silicate glass, silicon nitride, or doped silicate glass. The dielectric layer can be planarized as necessary to provide a planar top surface. The use of a self-planarizing dielectric material, such as spin-on-glass, is also useful. Additional processing is performed to complete the IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
a first substantially planar dielectric layer;
first conductive lines on a first level, said first conductive lines having a selected width and spaced apart a distance substantially equal to said selected width and located in said first dielectric layer;
a second substantially planar dielectric layer formed over said first dielectric layer;
second conductive lines on a second level, said second conductive lines having said selected width and spaced apart a distance substantially equal to said selected width and located in said second dielectric layer; and
at least one of said first conductive lines or said second conductive lines comprising a non-rectangular shaped cross-section.

2. The integrated circuit of claim 1 wherein both said first conductive lines and said second conductive lines have a non-rectangular cross-section.

3. An integrated circuit comprising:
a first substantially planar dielectric layer;
first conductive lines on a first level having a triangular cross-section and located in said first dielectric layer;
a second substantially planar dielectric layer formed over said first dielectric layer;
second conductive lines on a second level having a triangular cross-section and located in said second dielectric layer.

4. The integrated circuit of claim 2 wherein said cross-section of said first and second conductive lines is trapezoidal.

5. The integrated circuit of claim 3 wherein the uppermost portion of said conductive lines on said first level is below the lowermost portion of said conductive lines on said second level.

6. The integrated circuit of claim 3 wherein the uppermost portion of said conductive lines in said first level is co-planar with the lowermost portion of said conductive lines in said second level.

7. The integrated circuit of claim 1 wherein at least one sidewall of said non-rectangular shaped cross-section is non-vertical.

8. The integrated circuit of claim 2 wherein at least one sidewall of said non-rectangular shaped cross-section is non-vertical.

9. The integrated circuit of claim 3 wherein the conductive lines comprise a conductive material selected from a group consisting of aluminum, copper or alloys thereof.

10. An integrated circuit comprising:
a first substantially planar dielectric layer;
first conductive lines on a first level and located in said first dielectric layer;
a second substantially planar dielectric layer formed over said first dielectric layer;
second conductive lines on a second level and located in said second dielectric layer; and
at least one of said first conductive lines or said second conductive lines comprising a non-rectangular shaved cross-section; and wherein the pitch between adjacent first conductive lines and between adjacent second conductive lines is less than 2F.

11. An integrated circuit comprising:
first conductive parallel lines on one level separated by a selected pitch, said first conductive parallel lines having a selected width and spaced apart a distance substantially equal to said selected width;
second conductive parallel lines electrically isolated from said first conductive parallel lines located on another level separated by said selected pitch and having a non-rectangular shaped cross-section such that said first and second said conductive parallel lines may be arranged to reduce capacitance between said first and second conductive parallel lines at said selected pitch, said second conductive parallel lines having said selected width and spaced apart a distance substantially equal to said selected width.

12. The integrated circuit of claim 11 wherein said first conductive parallel lines have a rectangular cross-section.

13. The integrated circuit of claim 11 wherein said first conductive parallel lines have a non-rectangular cross-section.

14. The integrated circuit of claim 13 wherein said cross-sectional shape of said first and second conductive parallel lines is triangular shape.

15. An integrated circuit comprising:
first conductive parallel lines having a triangular cross-section on a lower level separated by a selected pitch;
second conductive parallel lines having a triangular cross-section on an upper level separated by said selected pitch such that said first and second said conductive parallel lines may be arranged to reduce capacitance between said first and second conductive parallel lines at said selected pitch and wherein the vertex of said triangular cross-sectional conductive parallel lines on said lower level points toward said second level and wherein the vertex of said triangular cross-sectional conductive parallel lines on said upper level points toward said lower level.

16. The integrated circuit of claim 15 wherein the vertexes of said conductive parallel lines on said lower level is co-planar with the vortexes of said conductive parallel lines on said upper level.

17. The integrated circuit of claim 15 wherein the vertexes of said conductive parallel lines on said upper level are spaced a selected distance vertically from the vertexes of said conductive parallel lines on said lower level.

18. The integrated circuit of claim 11 wherein said conductive parallel lines on said another level have first and second sidewalls and wherein at least one of said first and second sidewalls is non-vertical.

19. The integrated circuit of claim 13 wherein said cross-section shape of said first and second conductive parallel lines is trapezoidal shaped.

20. The integrated circuit of claim 11 wherein said one level is a lower level and said another level is an upper level.

21. The integrated circuit of claim 11 wherein said one level is an upper level and said another level is a lower level.

22. The integrated circuit of claim 18 wherein the first and second sidewalls are completely non-vertical.

23. An integrated circuit comprising:
first conductive parallel lines on one level separated by a selected pitch of less than 2F;
second conductive parallel lines on another level separated by said selected pitch and having a non-rectangular shaved cross-section such that said first and second said conductive parallel lines may be arranged to reduce capacitance between said first and second conductive parallel lines at said selected pitch.

24. The integrated circuit of claim 23 wherein the selected pitch is about 1.5F.

25. The integrated circuit of claim 3 wherein both said first conductive lines and said second conductive lines have a non-rectangular cross-section.

26. The integrated circuit of claim 25 wherein said cross-section of said first and second conductive lines is triangular.

27. The integrated circuit of claim 3 wherein the uppermost portion of said conductive lines on said first level is below the lowermost portion of said conductive lines on said second level.

28. The integrated circuit of claim 2 wherein the uppermost portion of said conductive lines in said first level is co-planar with the lowermost portion of said conductive lines in said second level.

29. The integrated circuit of claim 10 wherein the conductive lines comprise a conductive material selected from a group consisting of aluminum, copper or alloys thereof.

* * * * *

UNITED STATES PATENT AND TRADEMARK OFFICE
CERTIFICATE OF CORRECTION

PATENT NO. : 6,992,394 B2
DATED : January 31, 2006
INVENTOR(S) : Park et al.

It is certified that error appears in the above-identified patent and that said Letters Patent is hereby corrected as shown below:

Column 5,
Line 43, delete "shaved" and insert -- shaped --.

Column 6,
Line 42, delete "shaved" and insert -- shaped --.

Signed and Sealed this

Second Day of May, 2006

JON W. DUDAS
*Director of the United States Patent and Trademark Office*